(12) United States Patent
Riedel et al.

(10) Patent No.: US 8,116,142 B2
(45) Date of Patent: Feb. 14, 2012

(54) METHOD AND CIRCUIT FOR ERASING A NON-VOLATILE MEMORY CELL

(75) Inventors: Stephan Riedel, Dresden (DE); Boaz Eitan, Ra'anana (IL)

(73) Assignees: Infineon Technologies AG, Munich (DE); Spansion Israel Ltd, Netanya (IL)

( * ) Notice: Subject to any disclaimer, the term of this patent is extended or adjusted under 35 U.S.C. 154(b) by 1435 days.

(21) Appl. No.: 11/220,872

(22) Filed: Sep. 6, 2005

(65) Prior Publication Data
US 2007/0058444 A1    Mar. 15, 2007

(51) Int. Cl.
*G11C 16/04*    (2006.01)
(52) U.S. Cl. .............................. 365/185.29; 365/158.33
(58) Field of Classification Search ............. 365/185.29, 365/185.33
See application file for complete search history.

(56) References Cited

U.S. PATENT DOCUMENTS

| | | |
|---|---|---|
| 3,881,180 A | 4/1975 | Gosney, Jr. |
| 4,733,105 A | 3/1988 | Shin et al. |
| 4,742,491 A | 5/1988 | Liang et al. |
| 4,916,671 A | 4/1990 | Ichiguchi |
| 5,295,108 A | 3/1994 | Higa |
| 5,400,286 A | 3/1995 | Chu et al. |
| 5,477,499 A | 12/1995 | Van Buskirk et al. |
| 5,537,358 A | 7/1996 | Fong |
| 5,579,199 A | 11/1996 | Kawamura et al. |
| 5,590,074 A | 12/1996 | Akaogi et al. |
| 5,663,907 A | 9/1997 | Frayer et al. |
| 5,689,459 A | 11/1997 | Chang et al. |
| 5,715,193 A | 2/1998 | Norman |
| 5,717,635 A | 2/1998 | Akatsu |
| 5,768,193 A | 6/1998 | Lee et al. |
| 5,781,476 A | 7/1998 | Seki et al. |
| 5,870,334 A | 2/1999 | Hemink et al. |
| RE36,179 E | 4/1999 | Shimoda |
| 5,933,367 A | 8/1999 | Matsuo et al. |
| 5,946,258 A | 8/1999 | Evertt et al. |
| 5,949,714 A | 9/1999 | Hemink et al. |

(Continued)

FOREIGN PATENT DOCUMENTS

JP    63-249375    10/1988
(Continued)

OTHER PUBLICATIONS

Ricco et al., Nonvolatile Multilevel Memories for Digital Applications, Proceedings of the IEEE, Dec., 1998, 2399-2421, vol. 86, No. 12, Institute of Electrical and Electronics Engineers, Inc.
(Continued)

*Primary Examiner* — Hoai V Ho
(74) *Attorney, Agent, or Firm* — Eitan Mehulal Law Group

(57) ABSTRACT

The present invention is a method, circuit and system for erasing a non-volatile memory cell. A shunting element (e.g. transistor) may be introduced and/or activated between bit-lines to which one or more NVM cells being erased are connected. The shunting element may be located and/or activated across two bit-lines defining a given column of cells, where one or a subset of cells from the column may be undergoing an erase operation or procedure. The shunting element may be located, and/or activated, at some distance from the two bit-lines defining the given column of cells, and the shunting element may be electrically connected to the bit-lines defining the column through select transistors and/or through global bit-lines.

4 Claims, 8 Drawing Sheets

U.S. PATENT DOCUMENTS

| | | | |
|---|---|---|---|
| 5,969,993 | A | 10/1999 | Takeshima |
| 5,999,444 | A | 12/1999 | Fujiwara et al. |
| 6,034,896 | A | 3/2000 | Ranaweera et al. |
| 6,064,226 | A | 5/2000 | Earl |
| 6,064,591 | A | 5/2000 | Takeuchi et al. |
| 6,074,916 | A | 6/2000 | Cappelletti |
| 6,075,724 | A | 6/2000 | Li et al. |
| 6,088,265 | A * | 7/2000 | Ohta ............ 365/185.16 |
| 6,122,198 | A | 9/2000 | Haddad et al. |
| 6,128,227 | A | 10/2000 | Kim |
| 6,157,570 | A | 12/2000 | Nachumovsky |
| 6,163,484 | A | 12/2000 | Uekubo |
| 6,181,605 | B1 | 1/2001 | Hollmer et al. |
| 6,205,059 | B1 | 3/2001 | Gutala et al. |
| 6,214,666 | B1 | 4/2001 | Mehta |
| 6,215,148 | B1 | 4/2001 | Eitan |
| 6,215,702 | B1 | 4/2001 | Derhacobian et al. |
| 6,219,290 | B1 | 4/2001 | Chang et al. |
| 6,252,442 | B1 | 6/2001 | Malherbe |
| 6,252,799 | B1 | 6/2001 | Liu et al. |
| 6,256,231 | B1 | 7/2001 | Lavi et al. |
| 6,266,281 | B1 | 7/2001 | Derhacobian et al. |
| 6,304,485 | B1 | 10/2001 | Harari et al. |
| 6,307,784 | B1 | 10/2001 | Hamilton et al. |
| 6,326,265 | B1 | 12/2001 | Liu et al. |
| 6,330,192 | B1 | 12/2001 | Ohba et al. |
| 6,343,033 | B1 | 1/2002 | Parker |
| 6,400,607 | B1 | 6/2002 | Pasotti et al. |
| 6,426,898 | B1 | 7/2002 | Mihnea et al. |
| 6,438,035 | B2 | 8/2002 | Yamamoto et al. |
| 6,442,074 | B1 | 8/2002 | Hamilton et al. |
| 6,445,030 | B1 | 9/2002 | Wu et al. |
| 6,449,190 | B1 | 9/2002 | Bill |
| 6,456,528 | B1 | 9/2002 | Chen |
| 6,490,204 | B2 | 12/2002 | Bloom et al. |
| 6,512,701 | B1 | 1/2003 | Hamilton et al. |
| 6,522,585 | B2 | 2/2003 | Pasternak |
| 6,532,176 | B1 * | 3/2003 | Kushnarenko ............ 365/185.25 |
| 6,552,387 | B1 | 4/2003 | Eitan |
| 6,567,312 | B1 | 5/2003 | Torii et al. |
| 6,567,315 | B2 * | 5/2003 | Takase et al. ............ 365/185.28 |
| 6,636,440 | B2 | 10/2003 | Maayan et al. |
| 6,639,844 | B1 | 10/2003 | Liu et al. |
| 6,639,849 | B2 | 10/2003 | Takahashi et al. |
| 6,643,181 | B2 | 11/2003 | Sofer et al. |
| 6,700,818 | B2 | 3/2004 | Shappir et al. |
| 6,723,518 | B2 | 4/2004 | Papsidero et al. |
| 6,731,542 | B1 | 5/2004 | Le et al. |
| 6,738,289 | B2 | 5/2004 | Gongwer et al. |
| 6,794,249 | B2 | 9/2004 | Palm et al. |
| 6,871,258 | B2 | 3/2005 | Micheloni et al. |
| 6,885,585 | B2 | 4/2005 | Maayan et al. |
| 6,912,160 | B2 | 6/2005 | Yamada |
| 6,917,544 | B2 | 7/2005 | Maayan et al. |
| 6,928,001 | B2 | 8/2005 | Avni et al. |
| 6,937,523 | B2 | 8/2005 | Eshel |
| 6,967,872 | B2 | 11/2005 | Quader et al. |
| 6,996,692 | B2 | 2/2006 | Kouno |
| 2002/0132436 | A1 | 9/2002 | Eliyahu et al. |
| 2002/0140109 | A1 | 10/2002 | Keshavarzi et al. |
| 2002/0191465 | A1 | 12/2002 | Maayan et al. |
| 2003/0076710 | A1 | 4/2003 | Sofer et al. |
| 2003/0142544 | A1 | 7/2003 | Maayan et al. |
| 2003/0206435 | A1 | 11/2003 | Takahashi |
| 2003/0218913 | A1 | 11/2003 | Le et al. |
| 2003/0227796 | A1 | 12/2003 | Miki et al. |
| 2004/0027858 | A1 | 2/2004 | Takahashi et al. |
| 2004/0222437 | A1 | 11/2004 | Avni et al. |
| 2005/0140405 | A1 | 6/2005 | Do et al. |

FOREIGN PATENT DOCUMENTS

| | | |
|---|---|---|
| JP | 3-285358 | 12/1991 |
| JP | 408297988 | 11/1996 |
| WO | WO 01/65566 | 9/2001 |
| WO | WO 01/65567 | 9/2001 |
| WO | WO 02/43073 | 5/2002 |
| WO | WO 03/079370 | 9/2003 |
| WO | WO 03/088258 | 10/2003 |
| WO | WO 03/100790 | 12/2003 |

OTHER PUBLICATIONS

Umezawa, et al., A 5-V-Only Operation 0.6-µm Flash EEPROM with Row Decoder Scheme in Triple-Well Structure, IEEE Journal of Solid-State Circuits, 1992, 1540, vol. 27.

* cited by examiner

METHOD AND CIRCUIT FOR ERASING A NON-VOLATILE MEMORY CELL

FIELD OF THE INVENTION

The present invention generally relates to the field of non-volatile memory ("NVM") cells. More specifically, the present invention relates to a method and circuit for erasing one or more NVM cells.

BACKGROUND OF THE INVENTION

Non-volatile memory ("NVM") cells are fabricated in a large variety of structures, including but not limited to the Nitride Read Only Memory ("NROM"), as shown in FIG. 1. Until recently, NVM cells were primarily fabricated as "floating gate" devices, where charge could be injected into a conducting charge storage layer (e.g. poly-silicon) sandwiched between two insulation layers (e.g. silicon-oxide), and the injected charge could freely migrate across the charge storage layer. More recently, improved NVM cells such as the one shown in FIG. 1 and methods for their operation have been devised, such that the charge storage layer is composed of a dielectric, rather than a conducting material, and resulting in the possibility to store charges in multiple charge storage regions of a single charge storage layer, thereby increasing the number of logical values which may be stored on a single NVM device. As will be explained further below, although the improved multi-charge storage region devices have enhanced data storage capacity, they are susceptible to data corruption due to a variety of effects related to the operation of neighboring cells or devices.

Generally, the logical state of an NVM cell is defined by its threshold voltage ("$V_T$"), the voltage value which when applied to the NVM cell's gate populates the cell's channel with a sufficient number of charge carriers to enable the cell's channel to conduct current. In cases where the NVM cell is a multi-charge storage region device, each charge storage/trapping region may have its own associated $V_T$, where the $V_T$ for a given charge storage/trapping region may be defined as the voltage that when applied to the gate terminal of the device causes sufficient numbers of carriers near the Source, to populate a segment of the device's channel, near and beneath the charge storage region, so as to allow current to flow through the given channel segment. With most multi-charge storage devices, the charge storage regions are located on either side of the storage layer, and their respective channel segments are located beneath the charge storage regions, very near the junctions on either end of the channel. Various methods for operating (e.g. programming, reading and erasing) an NVM cells is known, but generally a cell's or a charge storage region's (as in the case of multi-charge storage region devices) $V_T$, which defines a logical state, is regulated by either injecting or removing charge from it's the relevant charge storage/trapping region.

FIG. 2A shows a voltage distribution graph depicting a correlation between an exemplary NVM cell's (from this point onward, the term cell will also apply to the each charge storage regions of a multi-charge storage region's cell) voltage threshold level and the exemplary cell's logical state. The threshold voltage distribution shown is for a binary non-volatile memory cell, wherein vertical lines of the graph depict boundary threshold voltage values between the binary NVM cell's possible logical states. For example: (1) when the cell's threshold voltage is determined to be below an Erase Verified ("EV"), voltage level, the cell's logical state is "Erased" (e.g. logical "1"); (2) when the cell's threshold voltage level is above a Program Verified ("PV") voltage level, the cell's logical state is "Programmed (e.g. logical "0"). Due to various phenomena that may cause the threshold voltage of a cell to fluctuate, up or down, other intermediate threshold levels, such as a Read Verify ("RV") level, may be used during the reading of an NVM cell. More specifically, when the cell's threshold voltage level is above a RV voltage level, the cell's logical state may be considered "programmed" (e.g. logical "0") and when the cell's threshold voltage level is below the RV level, the cell's logical state may be considered non-programmed or erased (e.g. logical "1").

FIG. 2B shows an extension of the binary NVM cell scenario of FIG. 2A, where the voltage distribution graph depicts possible threshold voltage distributions associated with the threshold voltage of a multi-level non-volatile memory cell ("MLC"), wherein one set of vertical lines depicts boundary values correlated with each of the cell's possible Program Verify Threshold Voltages (PV00, PV01, etc . . ) and another set of vertical lines depict boundary values correlated with the Read Verify level of each of the cell's possible Program states (RV00, RV01, etc . . ).

For purposes of producing mass data storage devices, NVM cells are usually organized into and fabricated as part of a large matrix of cells. Depending upon which one of the many known architectures and operating methodologies is used, each cell may be addressable, programmable, readable and/or erasable either individually or as part of a group/block of cells. Most cell array architectures, including virtual ground arrays, which are well known in the field, include the feature of a multiplicity of repeating segments formed into rows and columns. Each array segment may include a cell area formed of four segmented cell bit lines, an even select area, and an odd select area. The even select area may be located at one end of the cell area and may include a segmented even contact bit line and two select transistors connecting the even contact bit line with the even cell bit lines of the segment. The odd select area may be located at the opposite end of the cell area and may include a segmented odd contact bit line and two select transistors connecting the odd contact bit line with the odd cell bit lines of the segment. The array additionally may include one even contact connected to the even contact bit lines of two neighboring even select areas, one odd contact connected to the odd contact bit lines of two neighboring odd select areas and alternating even and odd metal lines connecting to the even and odd contacts, respectively.

Various methods for programming (i.e. injecting charge into the charge storage regions) and/or erasing (i.e. removing charge from a charge storage region) of individual cells within an NVM array are well known. For the most part, the amount of charge stored in a charge storage region of an NVM cell may be increased by applying one or more programming pulses to the cell, while conversely, the amount of charge in the charge storage region of a cell may decrease by applying one or more erase pulses to the gate terminal of an NVM cell, thus forcing the release of trapped charges from the cell's trap region and from the cell's trap interfaces. Alternatively the erase may constitute of injecting charge of opposite polarity rather than a physical removal of charge. For example if the programming is injecting electrons into the traps, the erase may be the injection of holes to the traps. The opposite charges may recombine and or cancel the effect of each other. More specifically, an erase procedure for one or more NVM cells may be characterized by the application of a strong negative voltage pulse to the gates, word lines, of the one or more cells (e.g. −7V), the application of a positive voltage to the drains of the cells (e.g. +3V to +7V) and allowing the sources of the cell to float. Neighboring cells within the same block as the cells being erased, but which are not undergoing erasure (i.e. unselected cells), may receive a positive inhibit voltage on their gate lines, typically between 3 to 5 volts. For cell's being erased, the charges stored in the trap region near the junction, slightly over the channel, are sunk in the drains of the cells being erased (or being recombined with the hole injection).

It should be understood by one of ordinary skill in the art that the preceding and proceeding discussions relating to the operation of a cell also apply to the operation of each charge storage region of a multi-charge storage region device. Multi-charge storage region NVM cells are known in the art and may store two or more logical values, where each logical value may be associated with a different charge storage region, and each charge storage region may be read from a terminal of the device.

Generally, when erasing a cell, one or more of the neighboring cells may also be affected by the erase operation, causing thereto a possible change in their threshold voltage and logical state. This unwanted change in threshold voltage of unselected cells is known in the art as the disturb problem, herein a "disturb".

In order to the address disturb conditions, some array architectures segment the bit-lines, where each row of the segmented bit-lines is called a "block" and each block typically includes block select transistors to enable the activation of only one block at a time. This feature is particularly important for FLASH electrically erasable, programmable, read only memory (FLASH EEPROM) arrays which pass high voltages along the bit-lines during erase operations. During erase operations, the bit-line voltages may disturb unselected cells. Thus, bit-lines may be segmented into relatively small blocks, thereby isolating blocks being erased from blocks not being erased. However, this solution is very costly in terms of area.

As mentioned above, another method which has been developed in order to mitigate the disturb effect on neighboring cells is the application of an "inhibit voltage" to one or more terminals of the cells not being operated (i.e. erased). Although the application of an inhibit voltage to the terminals of neighboring cells has been found effective in dramatically reducing the erase disturb of the high Vt state, it has been found that two new disturbs may occur. The first erase disturb is the reduction of a programmed Vt, and the $2^{nd}$ is the increase of the low erased Vt. The change in the threshold voltage of a cell connected to the same bit-line as a cell being erased may result in the change of the state of the cell. Thus, a programmed cell may become erased or an erased cell may become programmed.

The mechanism responsible for the disturb effect on neighboring cells (i.e. connected to the same bit-line having. inhibit WL voltage and floating source) is the current flow through their channel. This current charges the floating source lines, but also create hot electrons in their channel that can be injected into the trapping layer arid increase the Vt of an erased cell. These hot electrons can create holes by impact ionization and the holes may be injected into trapping layer and reduce the Vt of a programmed cell.

Although it would seem plausible to mitigate the above described disturb effect by applying substantially similar voltages to the source and drain bit-lines (i.e. not leaving the source bit-line floating), doing so has been found to have an adverse impact on the efficiency of the erase process. Short channel devices have been found to be susceptible to effects such as punch-through when the potential on the source and drain terminals are both raised during an erase process, and these effects greatly reduce the efficiency of the erase process while greatly increasing the amount of time and current required to achieve a full erase of a cell.

There is a need in the field of NVM array fabrication and operation for an improved method to mitigate neighboring cell disturbs during erase operations.

SUMMARY OF THE INVENTION

The present invention is a method, circuit and system for erasing a non-volatile memory cell. According to some embodiments of the present invention, a shunting element (e.g. transistor) may be introduced and/or activated between bit-lines to which one or more NVM cells being erased are connected. According to some embodiments of the present invention, the shunting element may be located and/or activated across two bit-lines defining a given column of cells, where one or a subset of cells from the column may be undergoing an erase operation or procedure. According to a further embodiment of the present invention, the shunting element may be located, and/or activated, at some distance from the two bit-lines defining the given column of cells, and the shunting element may be electrically connected to the bit-lines defining the column through select transistors and/or through global bit-lines.

According to some embodiments of the present invention an NVM array controller may activate the shunting element during the erasure procedure. According to further embodiments of the present invention, where the shunting element is not located on, or directly connected to the bit-lines to which the one or more NVM cells being erased are connected, the controller may also activate one or more select transistors so as to electrically connect the shunting element to the relevant bit-lines.

According to some embodiments of the present invention, during an erasure procedure on one or a subset of NVM cells within a column of NVM cells, the shunting element may provide a current path for charge which may build up on either or both of the bit-lines defining the column. The current path provided by the shunting element may be a result of the shunt element being a transistor with a lower threshold voltage than that of any of the NVM cells located on, or otherwise connected to, the column defined by the two bit-lines.

According to some further embodiments of the present invention, the shunting element may be a transistor and the difference between the gate voltage and the threshold voltage on the transistor may be higher than on any NVM cell located or otherwise connected to the column defined by the two bit-lines.

According to further embodiments of the present invention, for each one or a set of shunting elements, a gate voltage is selected such that during an erase operation the channel of each of the shunting element achieves a lower resistance than any of the NVM cells connected to the bit-lines which are being shunted. The shunting element gate voltage may also be selected such that the potential on the. source side bit-line is not raised sufficiently high to cause punch-through on the NVM cells during the operation.

According to some embodiments of the present invention, gate/control voltages for each one or a set of shunting elements may be selected during sorting and/or processing of a die. The selected shunting element gate/control voltages may be stored in a memory functionally associated with an NVM array controller located on the die. The controller may be functionally associated with the shunting elements and may apply to each shunting element the gate/control voltage determined suitable for its operation.

BRIEF DESCRIPTION OF THE DRAWINGS

The subject matter regarded as the invention is particularly pointed out and distinctly claimed in the concluding portion of the specification The invention, however, both as to organization and method of operation, together with objects, features and advantages thereof, may best be understood by reference to the following non limiting detailed description when read with the accompanied drawings in which:

Figure 1:
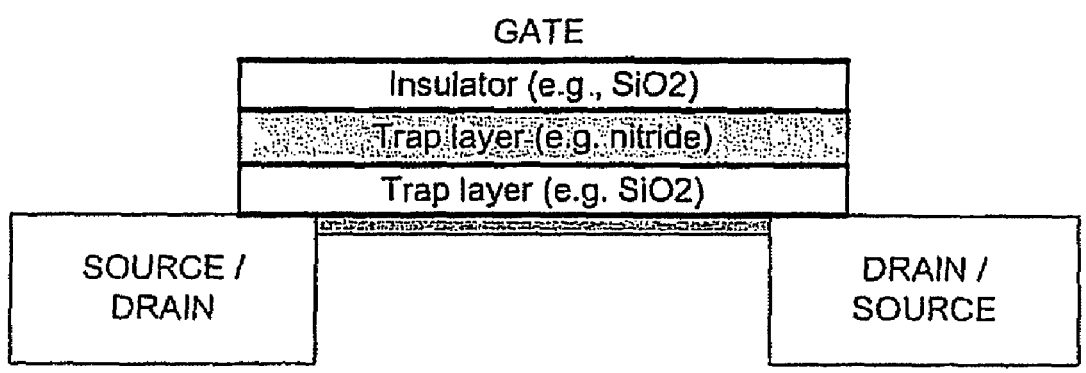
FIG. 1 shows a cross-section of a basic non-volatile memory cell, where the charge storage or trapping region is within a silicon-nitride layer, silicon nitride layer is between two silicon-oxide layers. The relative positions of the drain/source, source/drain and gate terminals of the cell are indicated.
Figure 2A:
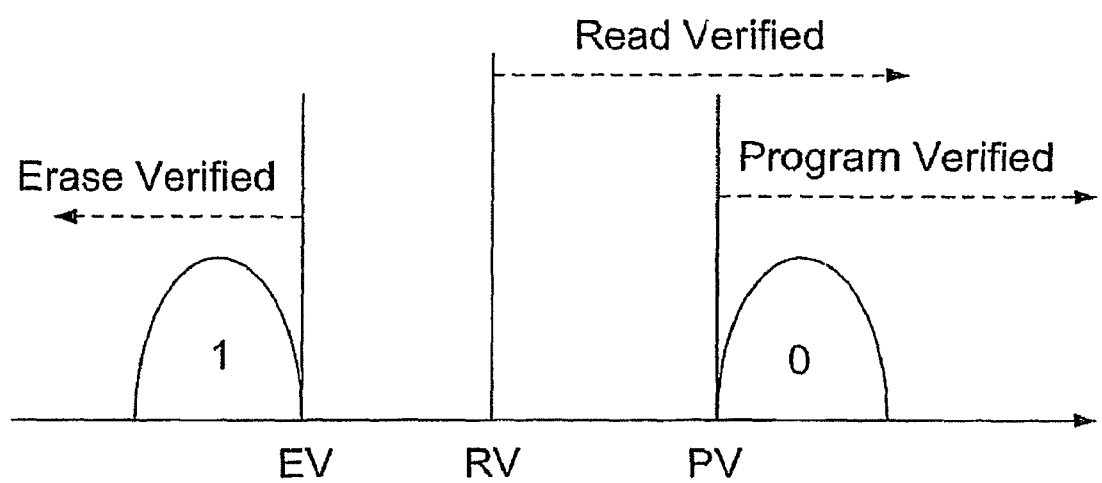
FIG. 2A shows a threshold voltage graph indicating the threshold voltage regions corresponding to each of the possible logical states of an exemplary binary NVM cell.
Figure 2B:
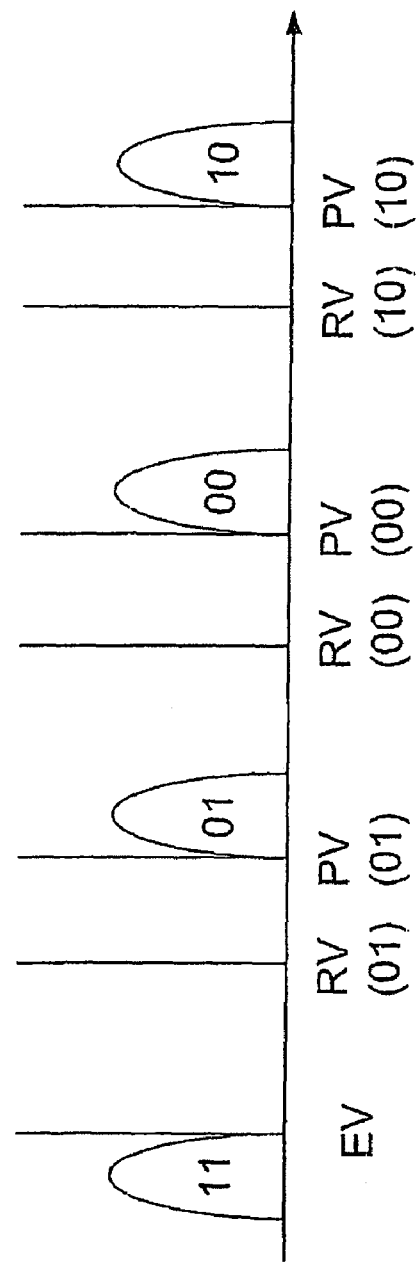
FIG. 2B shows a threshold voltage graph indicating the threshold voltage regions corresponding to each of the possible logical states of an exemplary MLC NVM cell.

It will be appreciated that for simplicity and clarity of these non limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

The present invention is a method, circuit and system for erasing a non-volatile memory cell. According to some embodiments of the present invention, a shunting element (e.g. transistor) may be introduced and/or activated between bit-lines to which one or more NVM cells being erased are connected. According to some embodiments of the present invention, the shunting element may be located and/or activated across two bit-lines defining a given column of cells, where one or a subset of cells from the column may be undergoing an erase operation or procedure. According to a further embodiment of the present invention, the shunting element may be located, and/or activated, at some distance from the two bit-lines defining the given column of cells, and the shunting element may be electrically connected to the bit-lines defining the column through select transistors and/or through global bit-lines.

According to some embodiments of the present invention an NVM array controller may activate the shunting element during the erasure procedure. According to further embodiments of the present invention, where the shunting element is not located on, or directly connected to the bit-lines to which the one or more NVM cells being erased are connected, the controller may also activate one or more select transistors so as to electrically connect the shunting element to the relevant bit-lines.

According to some embodiments of the present invention, during an erasure procedure on one or a subset of NVM cells within a column of NVM cells, the shunting element may provide a current path for charge which may build up on either or both of the bit-lines defining the column. The current path provided by the shunting element may be the result of the shunting element being a transistor having a threshold voltage lower than that of any of the NVM cells located on, or otherwise connected to, the column defined by the two bit-lines.

According to some further embodiments of the present invention, the shunting element may be a transistor and the difference between the gate voltage and the threshold voltage on the transistor may be higher than on any NVM cell located or otherwise connected to the column defined by the two bit-lines.

According to further embodiments of the present invention, for each one or a set of shunting elements, a gate voltage is selected such that during an erase operation the channel of each of the shunting element achieves a lower resistance than any of the NVM cells connected to the bit-lines which are being shunted. The shunting element gate voltage may also be selected such that the potential on the source side bit-line is not raised sufficiently high to cause punch-through on the NVM cells during the operation.

According to some embodiments of the present invention, gate/control voltages for each one or a set of shunting elements may be selected during sorting and/or processing of a die. The selected shunting element gate/control voltages may be stored in a memory functionally associated with an NVM array controller located on the die. The controller may be functionally associated with the shunting elements and may apply to each shunting element the gate/control voltage determined suitable for its operation.

Figure 3:
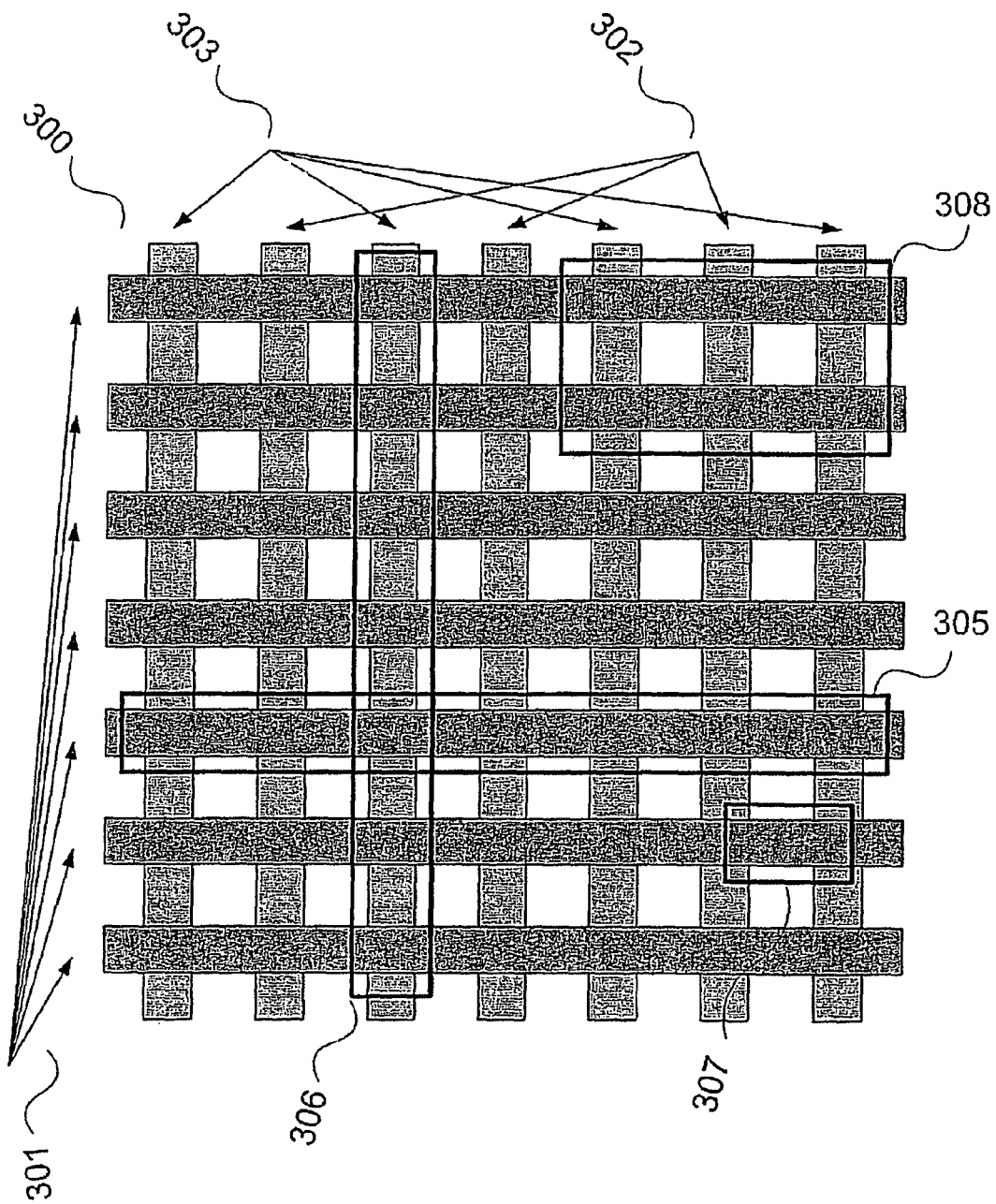
FIG. 3 shows a layout level diagram of an exemplary NVM array, which array may be operated according to some embodiments of the present invention.

Referring to now FIG. 3, an array of NVM cells is presented. The NVM cell array 300 is formed between the intersection of bit-lines 302 and 303 and the word-lines 301. The word lines correspond to the gate 100 of an NVM cell. The gates of every NVM cell in a row 305 may be connected through a metal line. Activating a single row 305 of the NVM array 300 implies that the gates connected to the activated word-line receive the same supply voltage assuming that the conductive losses in the metal line are negligible. The even 302 and odd 303 bit-lines may represent either the source or the drain of an NVM cell. Depending on the direction of the flow of the charges in the NVM cell due to the application of a voltage between successive bit-lines, the source and drain terminals may be defined. A positive voltage at the odd bit-lines 303, while maintaining the even bit-lines 302 grounded, defines the odd bit-lines 303 as the column of drain terminal and the even bit-lines 302 as the column of source terminals. A column 306 may share the same source or drain connections, as shown in FIG. 3.

Multiple methods to program and erase NVM cells are known. These methods deal with the profile of the applied voltage at the gate, source and drain terminals during the erase, program and read operations and they need not be detailed herein.

According to some embodiments of the present invention, the source terminal of an NVM cell 307 in a column of sources may be connected to the source terminal of an NVM cell in the same column of sources through a metal line. The drain terminal of an NVM cell 307 in a column of drains may be connected to the drain terminal of an NVM cell in the same column of drains through a metal line.

A block 308 is a matrix segment or sub-set that undergoes a specific operation. Multiple blocks 308 defined between the even 302 and odd 303 bit-lines and sharing the same column of drain and column of sources may undergo different operations depending on the voltage applied to the word lines 301. For example, two neighboring NVM cells 307 sharing the same column of sources and column of drains may be either not-erased or erased depending on the voltage applied to the word lines. During the erase operation of a NVM cell sharing the same column of drain and column of sources, the gate terminal of the NVM cell, may receive a negative voltage and the source of the NVM cell 307 may be floating while the word line of a neighboring non-erased NVM cell may receive a positive voltage.

Figure 4:
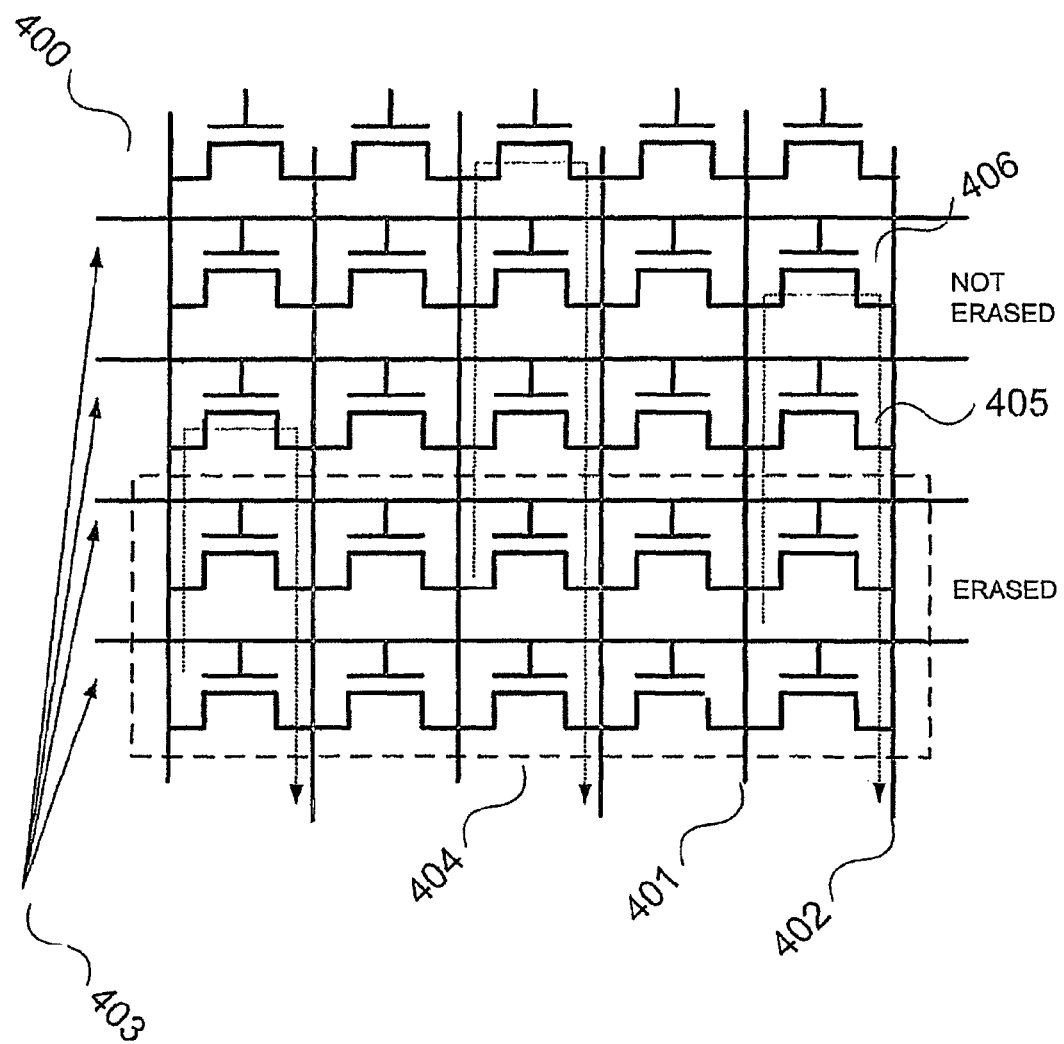
FIG. 4 shows a transistor level schematic diagram of a segment of an NVM memory array, where the odd bit-lines (column of drains) receive a positive voltage and the even bit-lines (column of sources) are left floating. Indicated with dashed lines is a subset of the array segment in which NVM cells are undergoing an erase process. Indicated by dotted lines are leakage currents through one of NVM cells not being erased, where the leakage currents may be as a result of charge accumulation which may occur on the source side bit-lines during the erase process.

A detailed schematic of the NVM array 300 using transistor level representations is shown in FIG. 4. The NVM array 400 may comprise NVM cells, odd bit-lines, even bit-lines and word-lines. The odd bit-lines 402 receive a positive voltage and the even-bit lines 401 may be left. floating during the erase operation.

FIG. 4 shows a segment or sub-set 404 comprised of erased cells which receive a negative voltage on the word-lines 403. The other cells remain not-erased as for instance no negative voltage is applied to the word-lines 403 of the non-erased cells. The negative charges accumulated at the floating source terminals of the erased cells in the segment 404 may generate a leakage current (parasitic current) flowing from the column of drains to the column of sources, from the sources into the substrate. The dotted line 405 indicates the leakage current which may result from the accumulation of charges on the floating sources during the erase operation The leakage current (405) may flow from the column of drains to the column of sources through the path (i.e. cell) that presents the lowest channel resistance. In the example of FIG. 4, the threshold voltage of the NVM cell 406 is the lowest among the NVM cells connected to the same bit lines. Thus, the excess of negative charges injected in the non-erased NVM cells 406 may disturb the threshold voltage of these cells as it changes the equivalent charge density in the oxide and the trap regions.

FIG. 4 shows the leakage current flowing only through the NVM cell 406 presenting the lowest threshold voltage. Leakage currents may also flow through additional cells presenting higher threshold voltage. However, as a higher channel resistance is observed for NVM cells with higher threshold voltage, the impact of the excess of charge in the trap and oxide regions and at the oxide-nitride and nitride-substrate interfaces on the threshold voltage may be reduced.

Figure 5:
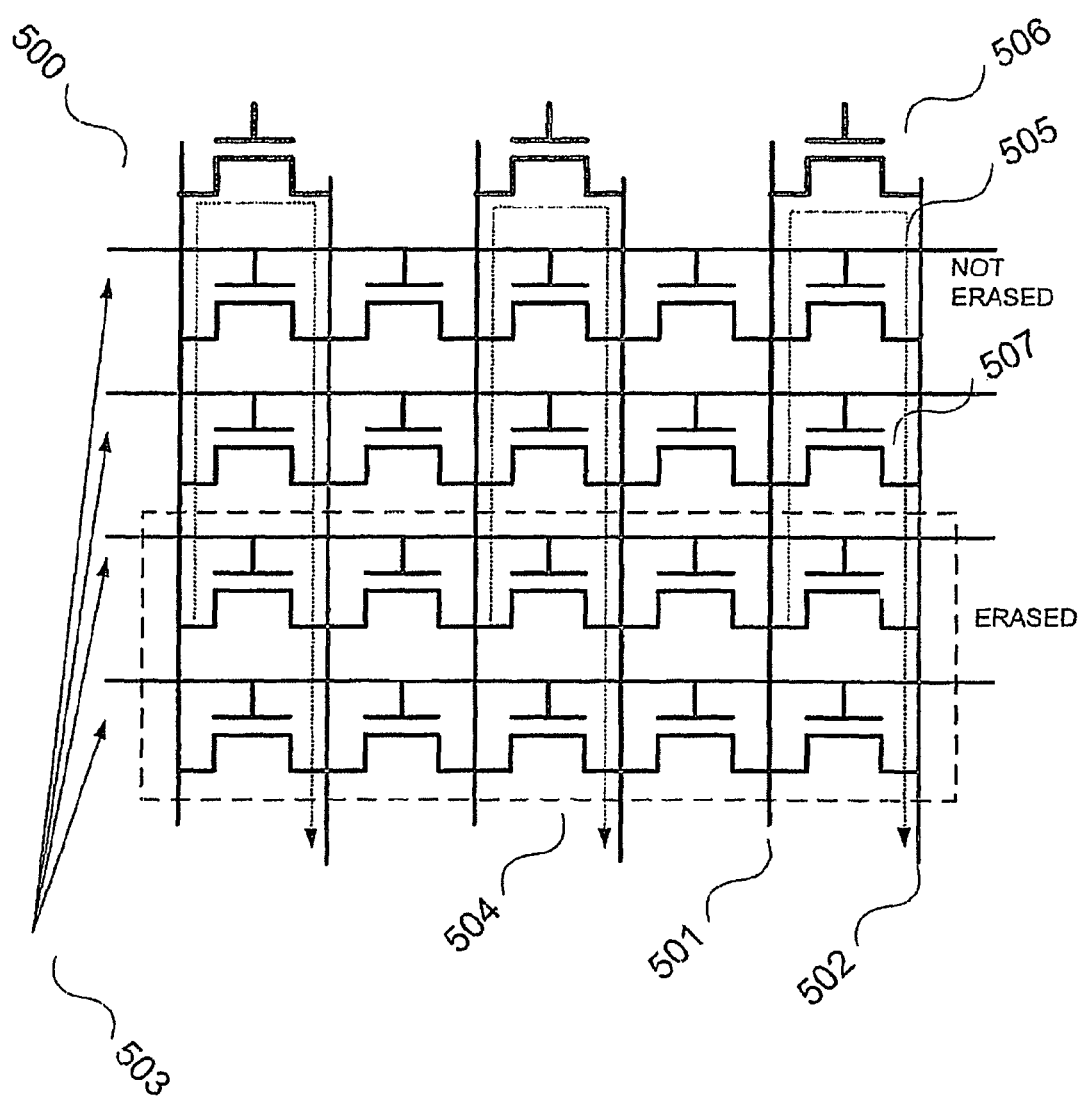
FIG. 5 shows a transistor level schematic diagram of a segment of an NVM memory array, where the odd bit-lines (column of drains) receive a positive voltage and the even bit-lines (column of sources) are left floating. Indicated with dashed lines is a subset of the array segment in which NVM cells are undergoing an erase process. Indicated by dotted lines are leakage currents through a shunt element located and connected to the same bit-lines as the cells being erased, according to some embodiments of the present.

Referring now to FIG. 5, there is shown a method and circuit according to some embodiments of the present invention to minimize the threshold variation during the erase operation of NVM cells. A detailed transistor level schematic diagram of a segment or sub-set of the memory array during the erase operation with a shunt device 506 is shown. The odd bit-lines or column of drains (502) may receive a positive voltage and the even bit-lines or column of sources (501) may be left floating. The word-lines 503 may be connected through the gate of the NVM cells. The array segment 500 may consists of a block of erased cells 504 and another block of non-erased cells. Indicated by the dotted line (505), is that the leakage current resulting from the accumulation of charges at the floating sources during the erase operation flows from the source to the drain terminals through the path with lowest channel resistance, in this case, the shunt element 506 having the lowest threshold voltage. The reduction of the leakage current through the non-erased NVM cells 507 of the array may reduce the variations in the threshold voltage of these NVM cells during the erase operation.

According to some embodiments of the present invention, a shunt element 506 with the lowest threshold voltage connected between the even bit-lines 501 and the odd bit-lines 502 may provide a path for the built up charge and may effectively reduce the variation of the threshold voltage of the non-erased NVM cells. The lower threshold variation of non-erased cells during the erase operation of the selected cells in 504 may enable the storage of additional data bits, e.g. the realization of additional threshold reference levels in NVM cells.

Although the embodiment of the present invention shows a shunting element connected to every second column of cells, one of ordinary skill in the art should understand that according to further embodiments of the present invention, a shunting element may be connected to all or substantially all the columns within an array segment. The shunt transistors may be connected to each of the columns directly, a shown in FIG. 5, or indirectly, as shown in FIG. 6.

Figure 6:
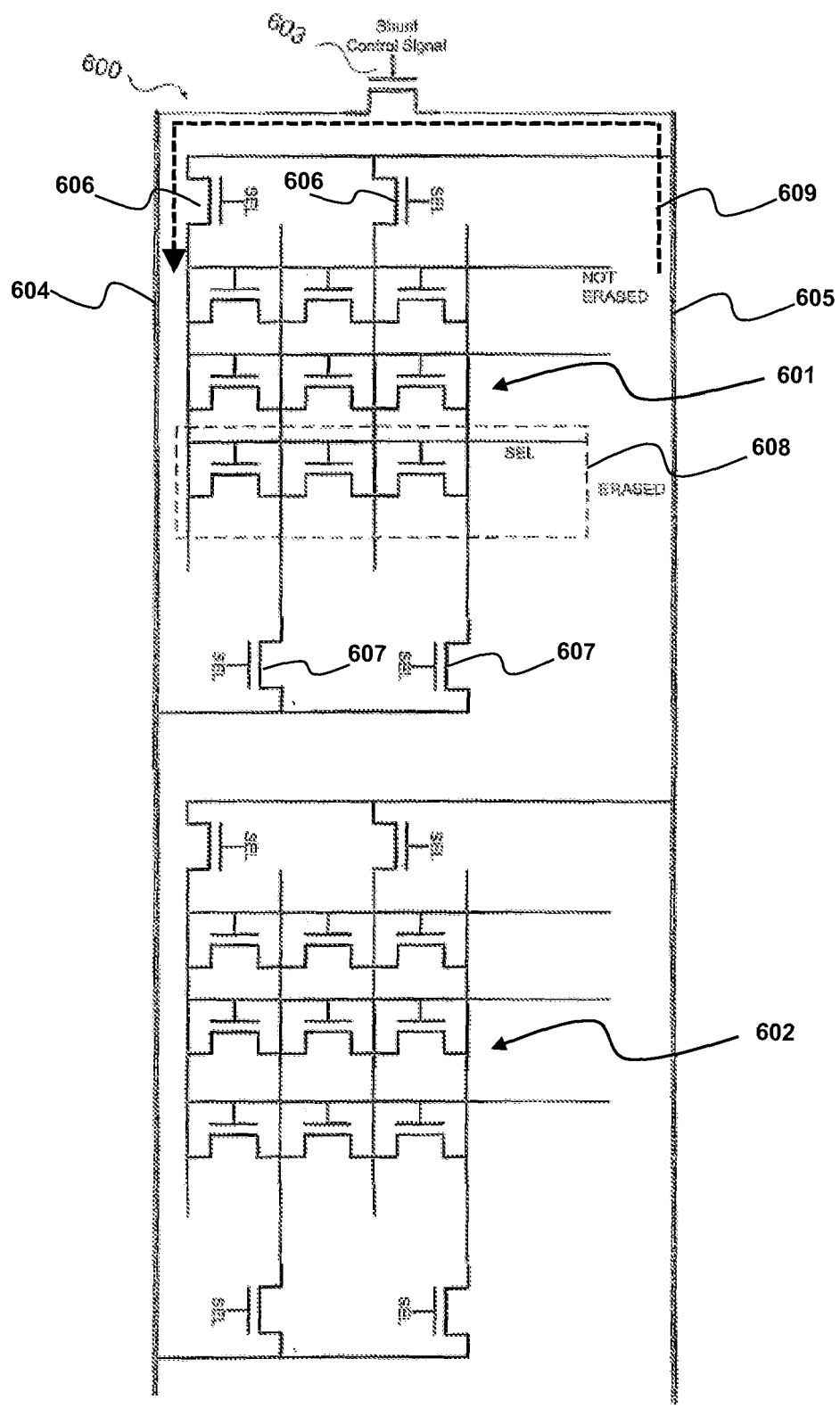
FIG. 6 shows one possible arrangement to connect two or more NVM array segments to a common shunt element. The shunt element may be placed between the global column of sources and the global column of drains. One or more select transistors may be used to select the bit-line of a segment to be shunted by the shunt element.

The ensemble 600 of FIG. 6 represents one possible arrangement to connect two or more NVM segments or sub-arrays to a common shunt device. In FIG. 6, two NVM sub arrays where each of the individual sub-arrays 601 and 602 are connected through a global column of sources 604 and global column of drains 605 and a common shunt device 603. The detailed description of the leakage current mechanism in NVM cells for a single array during the erase operation was presented in FIG. 4. The activation of the word-lines and bit-lines for the array shown of FIG. 6 is akin to the sub-array shown in FIG. 4.

Switching or select transistors 606 and 607 may enable the connectivity of a determined column of sources and column of drains in a sub-array (601 and 602) to a global column of source, 604, and global column of drain, 605, respectively. Each column of sources and column of drains in a sub-array may be connected to the global column of sources and column of drains, respectively. Depending on the state of the select transistors connecting the bit-lines to the global column of sources and column of drains, a specific bit-line may be selected.

A shunting element/transistor 603 may shunt the global column of source and column of drain during the erase operation. The threshold voltage of the shunt transistor 603 may provide the lowest threshold voltage of the NVM cells connected to the bit-lines in NVM array 600.

The shunting procedure during the erase operation can be described as follows: A positive voltage may be applied to the column of drains while the column of sources is left floating in a NVM sub-array. A negative voltage may be applied to the word-lines of the selected NVM cells to be erased in one of the sub-arrays. The dashed box 608 indicates the erased NVM cells. During the erase procedure, the switching/select transistor is activated, allowing the connectivity between the local bit-lines to the global bit-lines (604 and 605). The shunting element/transistor/device 603 is enabled during the erase operation. The leakage current 609 flows through the shunt device with the lowest channel resistance instead of flowing through the NVM cells connected in the same bit-line.

According to the embodiment shown in FIG. 6, the select/switching devices 606 and 607 may also have low threshold voltage. During the erase operation where the shunting device 603 and the switching transistors, 606 and 607, are active, the equivalent threshold voltage may be lower than the threshold voltage of the NVM cells sharing the same bit-line of the erased cells.

Figure 7:
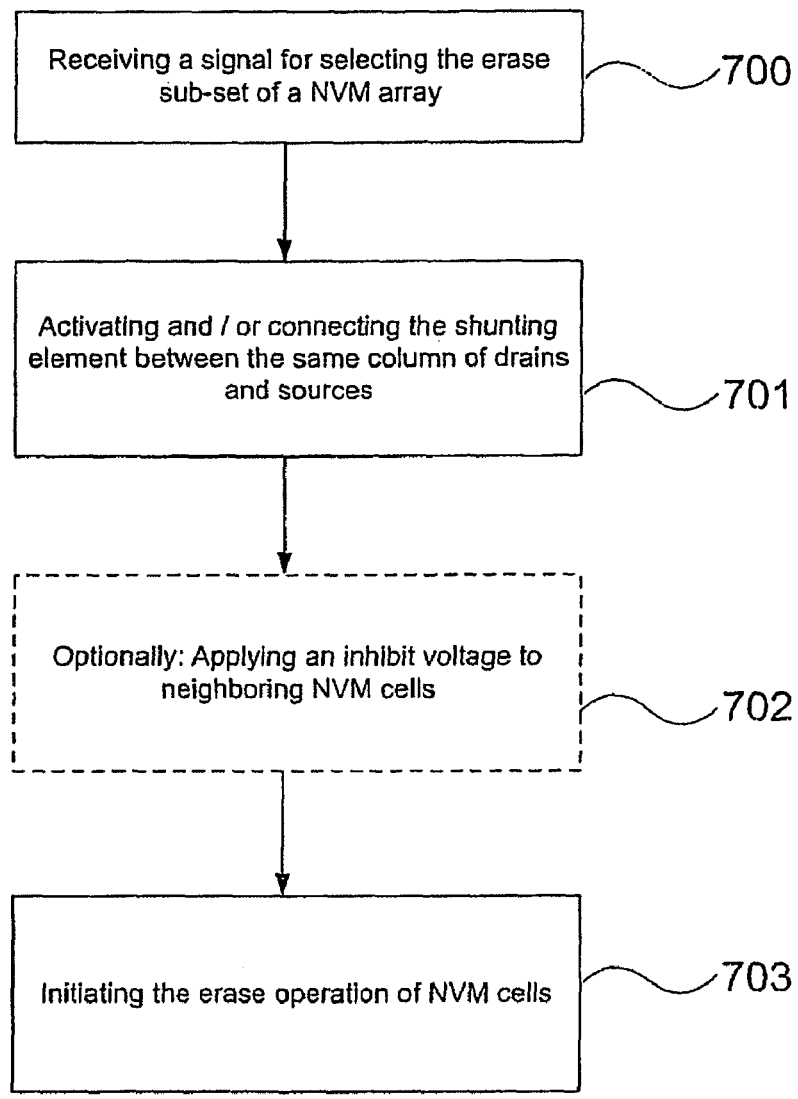
FIG. 7 illustrates the steps of a method of erasing one or more NVM cells according to some embodiments of the present invention.

Referring now to FIG. 7, there is shown the steps of a method according to some embodiments of the present invention to erase NVM cells. The selected NVM cells to be erased may first receive a signal at the bit-lines and word lines to initiate the erase operation, 700. The shunting element may shunt the even and odd bit-lines during the erase operation through the application of an activation signal, 701. The erase operation, 702, may be carried out such that the charges accumulated at the floating sources experiences the lowest channel resistance to the drain through the shunting element.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed:

1. A method of erasing a subset of non-volatile memory cells ("NVM") within a column segment of NVM cells having a first bit-line connected a first terminal of the NVM cells and a second bit line connected to the second terminal of the NVM cells, said method comprising:
    shunting through a shunting element the first bit-line to the second bit-line substantially concurrently to applying an erase voltage to a gate terminal of the subset of NVM cells to be erased.

2. The method according to claim 1, wherein shunting the first bit-line to the second bit-line includes activating a shunting element located on the same column as the sub-set of cells.

3. The method according to claim 1, wherein shunting the first bit-line to the second bit-line includes activating a shunting element located outside the same column as the sub-set of cells.

4. The method according to claim 3, further comprising electrically connecting the shunting element located outside the same column as the sub-set of cells with the same column as the sub-set of cells through one or more select transistors.

* * * * *